United States Patent
Wang et al.

(10) Patent No.: US 10,262,940 B2
(45) Date of Patent: Apr. 16, 2019

(54) ELECTRIC CONNECTOR

(71) Applicant: UNITED MICROELECTRONICS CORP., Hsin-Chu (TW)

(72) Inventors: Jhih-Ming Wang, Yunlin County (TW); Li-Cih Wang, Taoyuan (TW); Tien-Hao Tang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 2 days.

(21) Appl. No.: 15/667,637

(22) Filed: Aug. 3, 2017

(65) Prior Publication Data
US 2018/0358294 A1 Dec. 13, 2018

(30) Foreign Application Priority Data

Jun. 13, 2017 (CN) .......................... 2017 1 0441934

(51) Int. Cl.
*H01L 23/52* (2006.01)
*H01L 23/525* (2006.01)
*H01L 23/522* (2006.01)

(52) U.S. Cl.
CPC ...... *H01L 23/5256* (2013.01); *H01L 23/5223* (2013.01)

(58) Field of Classification Search
CPC .................. H01L 2224/821; H01L 27/14636
See application file for complete search history.

(56) References Cited

U.S. PATENT DOCUMENTS

| 7,518,192 | B2 | 4/2009 | Yu |
| 8,018,000 | B2 | 9/2011 | Chen |
| 2016/0049384 | A1* | 2/2016 | Lu ..................... H01L 21/76877 257/737 |

* cited by examiner

*Primary Examiner* — Fernando L Toledo
*Assistant Examiner* — Valerie N Newton
(74) *Attorney, Agent, or Firm* — Winston Hsu

(57) ABSTRACT

An electric connector includes a metal interconnect, a first vertical element and a second vertical element. The metal interconnect includes a plurality of horizontal elements. The first vertical element physically connects to a top surface of each of the horizontal elements. The second vertical element physically connects to a bottom surface of each of the horizontal elements, and the second vertical element misaligns the first vertical element. The present invention also provides an electric connector including a first vertical element and a second vertical element. The first vertical element physically connects to a top surface of a horizontal element. The second vertical element physically connects to a bottom surface of the horizontal element, and the second vertical element misaligns the first vertical element, wherein the first vertical element or the horizontal element is burned out before the second vertical element is burned out while a voltage is applied.

19 Claims, 3 Drawing Sheets

ELECTRIC CONNECTOR

BACKGROUND OF THE INVENTION

1. Field of the Invention

The present invention relates generally to an electric connector, and more specifically to an electric connector connecting metal interconnects.

2. Description of the Prior Art

Electrostatic Discharge (ESD) causes electronic devices or systems being damaged due to Electrical Overstress (EOS). Permanent damage of electronic devices or systems occurs by this damage, thus affecting the functions of Integrated Circuits (ICs) of the electronic devices or systems, leading to the electronic devices or systems shutting down. Anthropic factors are the main reason to make Electrostatic Discharge (ESD) occur, but they are difficult to be avoided. Electrostatic charges are accumulated in human bodies, instruments, storage equipment or etc. while manufacturing, producing, assembling, testing, storing or moving these electronic devices or systems (even these electronic devices or systems accumulate electrostatic charges themselves). While these electronic devices or systems contact each other, electrostatic discharge (ESD) currents occur.

Therefore, for the controlling of accumulating electrostatic charges, electrostatic discharge (ESD) protection devices should be included in electronic devices.

SUMMARY OF THE INVENTION

The present invention provides an electric connector, which sets the partial maximum current load of the electric connector to restrain the burning point of the electric connector, thereby preventing the whole circuit from working failure, and thus increasing the lifetime of a formed electronic device.

The present invention provides an electric connector including a metal interconnect, a first vertical element and a second vertical element. The metal interconnect includes a plurality of horizontal elements. The first vertical element physically connects to a top surface of each of the horizontal elements. The second vertical element physically connects to a bottom surface of each of the horizontal elements, and the second vertical element misaligns the first vertical element, wherein the second vertical element physically connects a diffusion region.

The present invention provides an electric connector including a first vertical element and a second vertical element. The first vertical element physically connects to a top surface of a horizontal element. The second vertical element physically connects to a bottom surface of the horizontal element, and the second vertical element misaligns the first vertical element, wherein the first vertical element or the horizontal element is burned out before the second vertical element is burned out while a voltage is applied.

According to the above, the present invention provides an electric connector, which has a first vertical element connected to a top surface of a horizontal element, and a second vertical element connected to a bottom surface of the horizontal element. While a voltage higher than a specific voltage is applied, the horizontal element or the above first vertical element is burned out before the second vertical element below the horizontal element is burned out, thereby a short circuit occurring before the second vertical element is burned out. Therefore, a permanent broken circuit caused by burning out the second vertical element can be avoided. Hence, this increases the lifetime of a formed electronic device including the electric connector.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
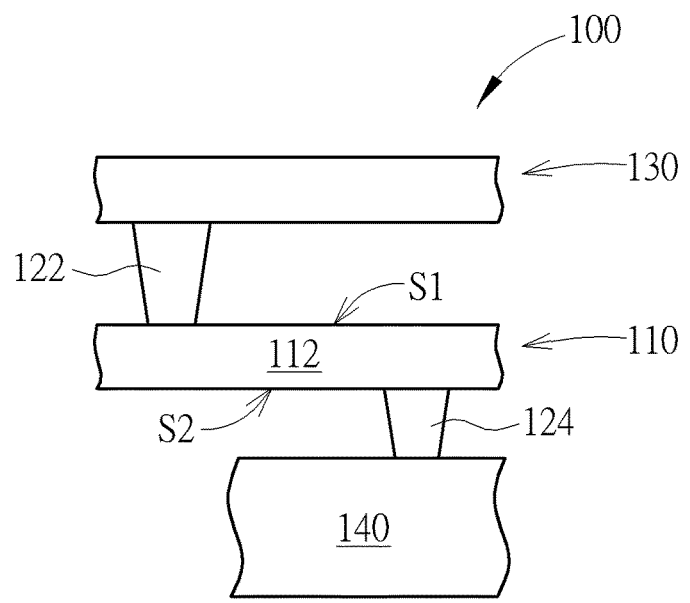
FIG. 1 schematically depicts a cross-sectional view of an electric connector according to an embodiment of the present invention.

FIG. 1 schematically depicts a cross-sectional view of an electric connector according to an embodiment of the present invention. As shown in FIG. 1, an electric connector 100 may include a metal interconnect 110, and the metal interconnect 110 may include a horizontal element 112. FIG. 1 is a cross-sectional view of an electric connector, thereby only one horizontal element 112 being depicted, but there may be a plurality of horizontal elements 112 arranged along a direction toward the paper. A top surface S1 of each of the horizontal elements 112 physically connects to a first vertical element 122, and a bottom surface S2 of each of the horizontal elements 112 physically connects to a second vertical element 124.

The horizontal element 112, the first vertical element 122 and the second vertical element 124 are composed of metals such as copper, aluminum or tungsten etc. In this embodiment, the metal interconnect 110 includes a first metal layer, and thus the first vertical element 122 may physically connect to above another metal interconnect such as a second metal layer, but it is not limited thereto. In this case, the first vertical element 122 is a via, but in another case the first vertical element 122 may be a plurality of vias. In this case, the second vertical element 124 is a contact plug, but in another case the second vertical element 124 may be a plurality of contact plugs. In this embodiment, the material of the first vertical element 122 is different from the material of the second vertical element 124, but it is not limited thereto.

It is emphasized that, the first vertical element 122 and the second vertical element 124 are misaligned, thereby the horizontal element 112 between the first vertical element 122 and the second vertical element 124 may have the easiest burning out point of the electric connector 100. Therefore, as a voltage applied on the electric connector 100 is larger than a specific voltage, (which is lower than the burning out voltage of the second vertical element 124,) the horizontal element 112 is burned out and thus a short circuit occurs in the electric connector 100. Hence, the burning out of the second vertical element 124 caused by a higher applied voltage can be avoided and the permanent damage of the electric connector 100 can be prevented, thereby increasing the lifetime of a formed device applying the electric connector 100. In this embodiment, the easiest burning out point of the electric connector 100 occurs at the horizontal element 112 between the first vertical element 122 and the second vertical element 124. In another embodiment, the easiest burning out point of the electric connector 100 may occur in the first vertical element 122. The horizontal element 112 and the first vertical element 122 are replaceable in the circuit of the device. As the horizontal element 112 or the first vertical element 122 is damaged, currents passing through the horizontal element 112 or the first vertical element 122 can turn to pass through other metal interconnects (not shown) or horizontal elements of metal interconnects (not shown) instead, to keep the device working. In other embodiments, the maximum load voltage of the first vertical element 122 and the horizontal element 112 is lower than the maximum load voltage of the second vertical element 124, thereby the first vertical element 122 or the horizontal element 114 being burned out before the second vertical element 124 is burned out while a voltage is applied. This can prevent the second vertical element 124 from being damaged, and thus achieve the purpose of avoiding the permanent damage of the device and increasing the lifetime of the device. In other words, the maximum load current of the horizontal element 112 is lower than the maximum load current of the second vertical element 124; or, the maximum load current of the first vertical element 122 is lower than the maximum load current of the second vertical element 124; or, the maximum load current of the horizontal element 112 and the first vertical element 122 is lower than the maximum load current of the second vertical element 124.

In one case, the second vertical element 124 may include a plurality of contact plugs while the first vertical element 122 may include only one single via. By doing this, the second vertical element 124 including a plurality of contact plugs can share currents even as one contact plug and one via have a same maximum load current. Thereby, the first vertical element 122 having only one single via is burned out before the second vertical element 124 is burned out while an overloaded voltage is applied, thus the second vertical element 124 and other elements of the device connecting to the second vertical element 124 can be prevented from being damaged.

In this embodiment, the second vertical element 124 is disposed on and electrically connects to a diffusion region 140. In a preferred embodiment, the second vertical element 124 physically connects to the diffusion region 140, thereby the second vertical element 124 and the diffusion region 140 physically connected to the second vertical element 124 can being prevented from being damaged. The diffusion region 140 may be a source region, a drain region, an anode or a cathode, but it is not limited thereto.

Figure 2:
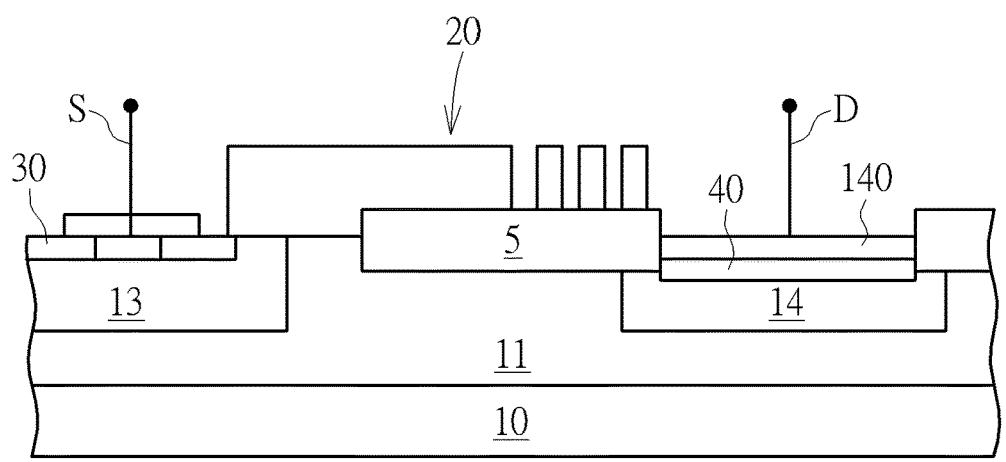
FIG. 2 schematically depicts a cross-sectional view of an electrostatic discharge (ESD) protection device according to an embodiment of the present invention.

In one embodiment, the diffusion region 140 may be a P-type ESD doped region (PESD). FIG. 2 schematically depicts a cross-sectional view of an electrostatic discharge (ESD) protection device according to an embodiment of the present invention. This embodiment is just one embodiment applying the present invention, but the present invention can also be applied in other electrostatic discharge (ESD) protection devices such as a bipolar junction transistor (BJT), a diode or a silicon controlled rectifier (SCR), but it is not limited thereto. The electrostatic discharge (ESD) protection device A may include a substrate 10, wherein a heavily doped well 14 is in the substrate 10; an electrode 20 is disposed on the substrate 10; an isolation structure 5 is sandwiched by the electrode 20 and the substrate 10; a drain region (meaning the diffusion region 140 as shown in FIG. 1) and a source region 30 are located beside the electrode 20, thereby a cathode S and an anode D can being formed; a doped region 40 is located below the drain region 140; and two wells 13/14 are doped beside the electrode 20. Methods of forming the electrostatic discharge (ESD) protection device A are well known in the art, and are not described herein. The electric connector 100 of FIG. 1 connecting the drain region of the electrostatic discharge (ESD) protection device A, so that the first vertical element 122 or the horizontal element 112 is burned out before the second vertical element 124 is burned out while an overloaded voltage is applied. Hence, this prevents the electrostatic discharge (ESD) protection device A from being damaged.

Figure 3:
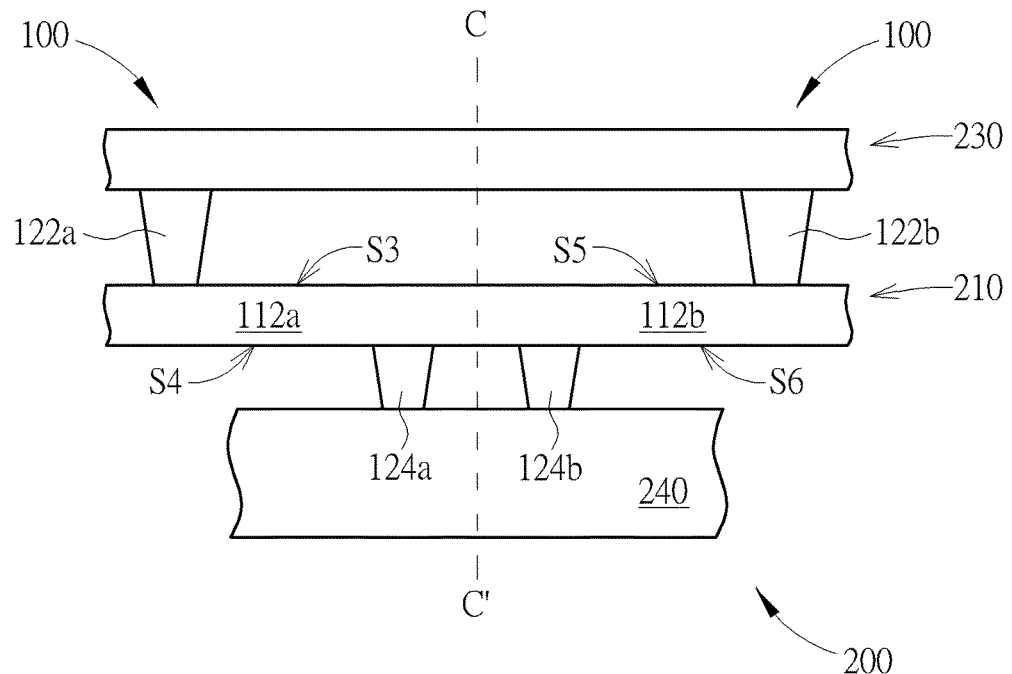
FIG. 3 schematically depicts a cross-sectional view of an electric connector according to another embodiment of the present invention.

The electric connector of the present invention may include other structures. FIG. 3 schematically depicts a cross-sectional view of an electric connector according to another embodiment of the present invention. As shown in FIG. 3, an electric connector 200 may include two electric connectors 100 disposed symmetrically. The two electric connectors 100 are disposed symmetrically along line CC' to constitute the electric connector 200. Therefore, the electric connector 200 may include a metal interconnect 210, and the metal interconnect 210 may include two horizontal elements 112a/112b, wherein a top surface S3 of the horizontal element 112a physically connects to a first vertical element 122a, a bottom surface S4 of the horizontal element 112a physically connects to a second vertical element 124a, a top surface S5 of the horizontal element 112b physically connects to a first vertical element 122b, a bottom surface S6 of the horizontal element 112b physically connects to a second vertical element 124b, and the first vertical element 122a and the first vertical element 122b respectively connect to a metal interconnect 230. The metal interconnect 210 may be a first metal layer while the metal interconnect 230 may be a second metal layer, but it is not limited thereto. The second vertical element 124a and the second vertical element 124b physically connect to a diffusion region 240. The diffusion region 240 may be a source region or a drain region, but it is not limited thereto.

Figure 4:
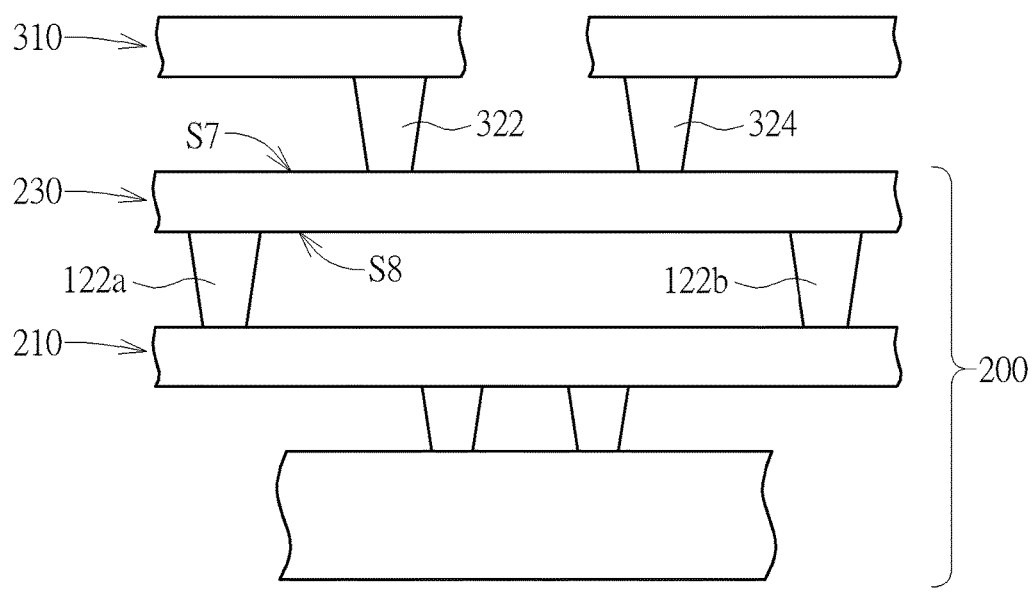
FIG. 4 schematically depicts a cross-sectional view of an electric connector according to another embodiment of the present invention.

The present invention may include a plurality of metal interconnects. For instance, the electric connector 200 may include one metal interconnect 210 and one metal interconnect 230, and the metal interconnect 230 has the function of being an electric connector just as the metal interconnect 210. As shown in FIG. 4, another metal interconnect 310 may be disposed above the metal interconnect 230. The metal interconnect 210, the metal interconnect 230 and the metal interconnect 310 may be arranged vertically. First vertical elements 322/324 connecting a top surface S7 of the metal interconnect 230 and the first vertical elements 122a/122b connecting a bottom surface S8 of the metal interconnect 230 may constitute another electric connector of the present invention, depending upon practical requirements.

Figure 5:
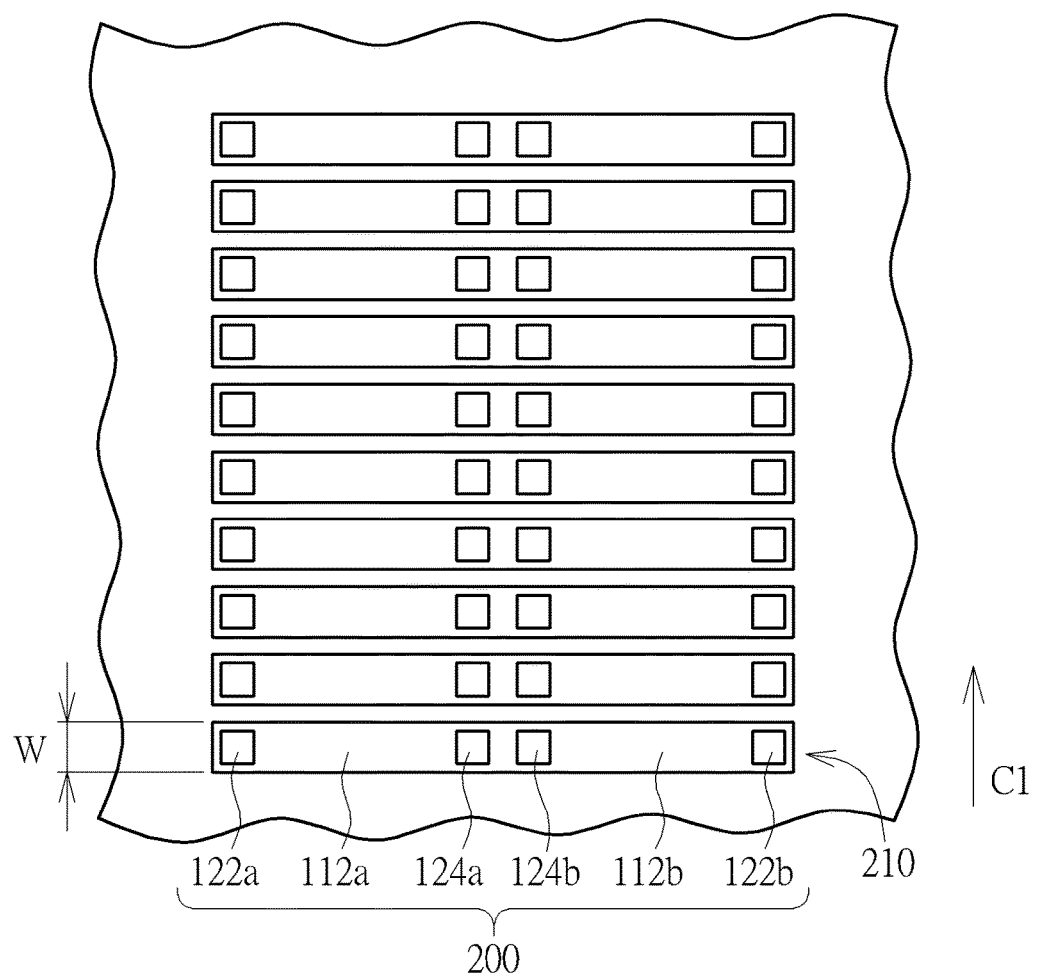
FIG. 5 schematically depicts a top view of an electric connector according to an embodiment of the present invention.

FIG. 5 schematically depicts a top view of an electric connector according to an embodiment of the present invention. As shown in FIG. 5, the metal interconnect 210 of the electric connector 200 may include a plurality of horizontal elements 112a/112b, and the horizontal elements 112a/112b arranged side by side along a first direction C1. In this embodiment, the horizontal elements 112a/112b are parallel to each other, and can be replaced by each other in one same circuit. As one of the horizontal elements 112a/112b is damaged, current passing through this horizontal element 112a/112b can be replaced by the others of the horizontal elements 112a/112b, but it is not limited thereto. In a preferred embodiment, each of the first vertical elements 122a/122b only has one single via along a width direction (meaning the first direction C1) of the corresponding horizontal elements 112a/112b, to avoid a plurality of vias being disposed in a narrow width W of each of the horizontal elements 112a/112b.

To summarize, the present invention provides an electric connector, which includes a metal interconnect including one or a plurality of horizontal elements, wherein a first vertical element connects to a top surface of each horizontal element, and a second vertical element connects to a bottom surface of each horizontal element. While a voltage higher than a specific voltage is applied, the horizontal element or the above first vertical element is burned out before the second vertical element below the horizontal element is burned out, thereby a short circuit occurs before the second vertical element is burned out. Therefore, a permanent broken circuit caused by burning out the second vertical element can be avoided. Hence, this increases the lifetime of a formed electronic device including the electric connector. Therefore, the maximum load current of the horizontal element is lower than the maximum load current of the corresponding second vertical element, or/and the maximum load current of the first vertical element is lower than the maximum load current of the second vertical element.

The electric connector of the present invention may connect to a diffusion region of a device through the second vertical element. For example, the diffusion region may be a drain region. Thereby, the second vertical element and the diffusion region connected to the second vertical element can be prevented from being damaged. Moreover, the horizontal elements may be arranged side by side along a first direction. Preferably, the horizontal elements are parallel to each other, therefore the horizontal elements can be replaced by each other in connecting to one same circuit. That is, currents passing through one of the horizontal elements can turn to pass through the others of the horizontal elements instead while this horizontal element is burned out. Furthermore, the electric connector of the present invention may include a plurality of metal interconnects arranged vertically.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electric connector, comprising:
    a metal interconnect comprising a plurality of horizontal elements;
    a first vertical element physically connecting to a top surface of each of the horizontal elements; and
    a second vertical element physically connecting to a bottom surface of each of the horizontal elements, and the second vertical element misaligning the first vertical element, wherein the second vertical element physically connects a diffusion region, and the maximum load current of each of the horizontal elements is lower than the maximum load current of the second vertical element.

2. The electric connector according to claim 1, wherein the horizontal elements are arranged side by side along a first direction.

3. The electric connector according to claim 2, wherein the horizontal elements are parallel to each other.

4. The electric connector according to claim 2, wherein the first vertical element physically connecting each of the horizontal elements only has one single via along the first direction.

5. The electric connector according to claim 1, wherein the first vertical element comprises a via or a plurality of vias.

6. The electric connector according to claim 1, wherein the second vertical element comprises a contact plug or a plurality of contact plugs.

7. The electric connector according to claim 6, wherein the second vertical element comprises a plurality of contact plugs while the first vertical element comprises only one single via.

8. The electric connector according to claim 1, wherein the metal interconnect comprises a first metal layer.

9. The electric connector according to claim 1, wherein the metal interconnect is disposed on a diffusion region.

10. The electric connector according to claim 1, wherein the diffusion region comprises an anode or a cathode of an electrostatic discharge (ESD) protection device.

11. The electric connector according to claim 1, wherein the maximum load current of the first vertical element is lower than the maximum load current of the second vertical element.

12. The electric connector according to claim 1, wherein the electric connector comprises a plurality of the metal interconnects, and the metal interconnects are vertically arranged.

13. An electric connector, comprising:
    a first vertical element physically connecting to a top surface of a horizontal element; and
    a second vertical element physically connecting to a bottom surface of the horizontal element, and the second vertical element misaligning the first vertical element, wherein the first vertical element or the horizontal element is burned out before the second vertical element is burned out while a voltage is applied.

14. The electric connector according to claim 13, wherein the first vertical element only has one single via along a width direction of the horizontal element.

15. The electric connector according to claim 13, wherein the second vertical element comprises a plurality of contact plugs while the first vertical element comprises only one single via.

16. The electric connector according to claim 13, wherein the second vertical element physically connects a diffusion region, and the diffusion region comprises a cathode or an anode.

17. The electric connector according to claim 13, wherein the maximum load current of the horizontal element is lower than the maximum load current of the second vertical element.

18. The electric connector according to claim 13, wherein the maximum load current of the first vertical element is lower than the maximum load current of the second vertical element.

19. An electric connector, comprising:
    a metal interconnect comprising a plurality of horizontal elements;
    a first vertical element physically connecting to a top surface of each of the horizontal elements; and
    a second vertical element physically connecting to a bottom surface of each of the horizontal elements, and the second vertical element misaligning the first vertical element, wherein the second vertical element physically connects a diffusion region, and the maximum load current of the first vertical element is lower than the maximum load current of the second vertical element.

\* \* \* \* \*